(12) United States Patent
Kim

(10) Patent No.: US 12,009,058 B2
(45) Date of Patent: Jun. 11, 2024

(54) ADDRESS LATCH, ADDRESS CONTROL CIRCUIT AND SEMICONDUCTOR APPARATUS INCLUDING THE ADDRESS CONTROL CIRCUIT

(71) Applicant: SK hynix Inc., Icheon-si (KR)

(72) Inventor: Ji Eun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 173 days.

(21) Appl. No.: 17/672,069

(22) Filed: Feb. 15, 2022

(65) Prior Publication Data
US 2023/0071572 A1 Mar. 9, 2023

(30) Foreign Application Priority Data
Sep. 7, 2021 (KR) .................. 10-2021-0119099

(51) Int. Cl.
*G11C 8/00* (2006.01)
*G06F 3/06* (2006.01)
*G11C 8/06* (2006.01)
*G11C 8/10* (2006.01)

(52) U.S. Cl.
CPC .............. *G11C 8/06* (2013.01); *G06F 3/061* (2013.01); *G06F 3/0659* (2013.01); *G06F 3/0679* (2013.01); *G11C 8/10* (2013.01)

(58) Field of Classification Search
CPC ........... G11C 8/08; G11C 8/18; G11C 7/1078; G11C 7/1051; G11C 7/22
USPC ..................................... 365/230.08
See application file for complete search history.

(56) References Cited

U.S. PATENT DOCUMENTS

| 6,275,437 | B1 | 8/2001 | Kim et al. | |
| 10,923,167 | B2* | 2/2021 | Kim ...................... | G11C 11/418 |
| 2011/0161581 | A1* | 6/2011 | Shin ...................... | G11C 7/1078 365/240 |
| 2013/0279271 | A1* | 10/2013 | Yoon ................... | G11C 11/4076 365/189.05 |
| 2020/0211630 | A1 | 7/2020 | Kim | |

\* cited by examiner

*Primary Examiner* — Son T Dinh
(74) *Attorney, Agent, or Firm* — WILLIAM PARK & ASSOCIATES LTD.

(57) ABSTRACT

Disclosed are an address latch, an address control circuit, and a semiconductor apparatus including the address control circuit. The address latch includes a first address processing unit and a second address processing unit. The first address processing unit latches an external address signals to output first latched signals through an output node based on a read command and a write command. The second address processing unit latches the external address signals based on the read command with a burst length set to a first value and outputs second latched signals through the output node based on an internal read command.

17 Claims, 7 Drawing Sheets

ADDRESS LATCH, ADDRESS CONTROL CIRCUIT AND SEMICONDUCTOR APPARATUS INCLUDING THE ADDRESS CONTROL CIRCUIT

CROSS-REFERENCES TO RELATED APPLICATION

The present application claims priority under 35 U.S.C. § 119(a) to Korean application number 10-2021-0119099, filed on Sep. 7, 2021, in the Korean Intellectual Property Office, which is incorporated herein by reference in its entirety as set forth in full.

BACKGROUND

1. Technical Field

Various embodiments generally relate to a semiconductor circuit, and, more particularly, to an address latch, an address control circuit and a semiconductor apparatus including the address control circuit.

2. Related Art

A semiconductor memory apparatus as an example of a semiconductor apparatus may include an address control circuit configured to process an address signal that is provided from an external. The address control circuit may include various circuit configurations for supporting a read operation and a write operation for various operational modes of the semiconductor memory apparatus. As the configurations of the address control circuit become complicated, there occur problems that a layout margin becomes reduced and a delay becomes greater in the course of address processing.

SUMMARY

In an embodiment, an address latch may include a first address processing unit and a second address processing unit. The first address processing unit may be configured to latch an external address signals to output first latched signals through an output node based on a read command and a write command. The second address processing unit may be configured to latch the external address signals based on the read command with a burst length that is set to a first value and configured to output second latched signals through the output node based on an internal read command.

In an embodiment, an address control circuit may include a read/write combined address latch, a pipe register, and a decoder. The read/write combined address latch may be configured to latch external address signals, which are input from an external of a semiconductor apparatus, according to a read command or a write command, to output first latched signal through a first output line and configured to output, according to an internal read command, second latched signals, which are latched according to the read command with a burst length set to a first value, through the first output line. The pipe register may be configured to store, therein, signals that are output through the first output line during a write operation of the semiconductor apparatus based on a plurality of input/output control signals and configured to output the stored signals through a second output line that is coupled to the first output line. The decoder may be configured to decode signals, which are output through the second output line, to generate at least one of a bank group address, a bank address and a column address.

In an embodiment, a semiconductor apparatus may include a memory region, a data input/output circuit, an address control circuit and an address decoder. The memory region may include a plurality of memory cells, which are divided into a plurality of memory banks. The data input/output circuit may be coupled to the memory region and may be configured to exchange data with the memory region or an external device. The address control circuit may be configured to latch external address signals, which are input from the external device, according to a read command or a write command to output first latched signals through a first output line, configured to latch the external address signals, according to the read command with a burst length set to a first value, to output second latched signals, according to an internal read command, through the first output line, and configured to decode signals, which are output through the first output line, to generate a bank group address, a bank address, and a column address. The address decoder may be configured to decode the bank group address, the bank address, and the column address to access the memory region based on a result of the decoding.

DETAILED DESCRIPTION

According to an embodiment, provided may be an address latch, an address control circuit and a semiconductor apparatus including the address control circuit capable of reducing a delay in a course of address processing and increasing a layout margin.

Hereinafter, exemplary embodiments of the present disclosure will be described below with reference to the accompanying drawings.

Figure 1:
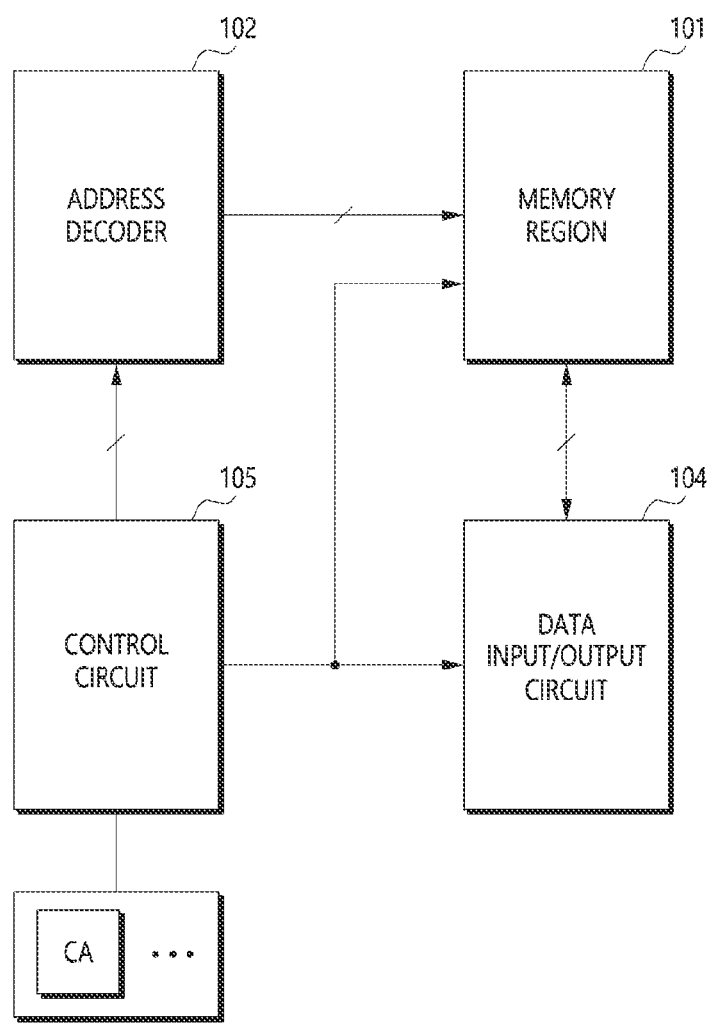
FIG. 1 is a diagram illustrating a configuration of a semiconductor apparatus in accordance with an embodiment.

FIG. 1 is a diagram illustrating a configuration of a semiconductor apparatus 100 in accordance with an embodiment.

Referring to FIG. 1, the semiconductor apparatus 100 may include a memory region 101, an address decoder 102, a data input/output circuit 104, and a control circuit 105.

The memory region 101 may include a plurality of memory cells, each of which includes at least one of a volatile memory and a non-volatile memory. The volatile memory may include a static random access memory (static RAM: SRAM), a dynamic RAM (DRAM), and a synchronous DRAM (SDRAM). The nonvolatile memory may include a read only memory (ROM), a programmable ROM (PROM), an electrically erasable, and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM), and so forth. During a read operation of the semiconductor apparatus 100, data may be read out from the memory region 101. During a write operation of the semiconductor apparatus 100, data that is provided from an external device may be stored into the memory region 101. The memory cells of the memory region 101 may be divided into a plurality of unit memory regions, e.g., a plurality of memory banks. For example, the plurality of memory banks may be divided into bank groups for a read operation and a write operation of the semiconductor apparatus 100.

The address decoder 102 may be coupled to the control circuit 105 and the memory region 101. The address decoder 102 may decode an address signal that is provided from the control circuit 105 and may access the memory region 101 according to a result of the decoding. The address signal that is provided from the control circuit 105 may include a row address signal and a column address signal. The row address signal may include a bank group address, a bank address, and so forth.

The data input/output circuit 104 may be coupled to the memory region 101. The data input/output circuit 104 may exchange data with an external device or an internal circuit of the semiconductor apparatus 100. The data input/output circuit 104 may include a data input buffer, a data output buffer, a data input/output pad, and so forth.

The control circuit 105 may be coupled to the memory region 101, the address decoder 102, and the data input/output circuit 104. The control circuit 105 may perform a control operation that is related to a read operation, a write operation, and address processing of the semiconductor apparatus 100. The control circuit 105 may receive, through command/address pins CA, a command and an external address from an external device. The control circuit 105 may include an address control circuit. The address control circuit may control an address signal for a read operation and a write operation in respective operational modes of the semiconductor apparatus 100. The address control circuit may latch the address signal at a predetermined timing for a read operation and a write operation in respective operational modes of the semiconductor apparatus 100. Through the command/address pins CA, the command and the external address signal may be sequentially input at predetermined timings.

Figure 2:
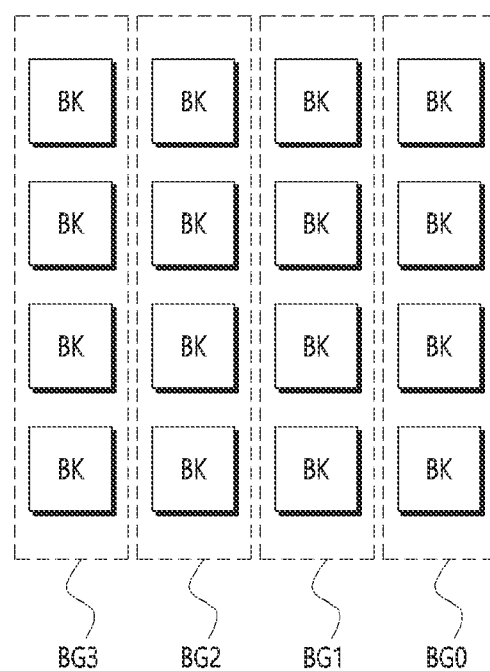
FIG. 2 is a diagram illustrating a configuration of a memory region of FIG. 1.

FIG. 2 is a diagram illustrating a configuration of the memory region 101 of FIG. 1.

Referring to FIG. 2, the memory region 101 may include a plurality of unit memory blocks, e.g., a plurality of memory banks BK. The semiconductor apparatus 100 may divide the plurality of memory banks BK in units of groups. The semiconductor apparatus 100 may divide the plurality of memory banks BK into a plurality of bank groups BG0 to BG3. Each of the plurality of bank groups BG0 to BG3 may include a plurality of memory banks BK, e.g., four memory banks BK.

A semiconductor memory apparatus should support various operational modes. For example, the operational modes of the semiconductor memory apparatus may include an 8-bank mode, a 16-bank mode, and a bank group mode. For example, in a bank group mode that corresponds to a low power double data rate 5 (LPDDR5), read/write operations may be continuously performed on different bank groups with a very short time interval, i.e., the time interval tCCD_S that is referred to as "Column-to-Column Delay short". In the bank group mode, a timing margin may be secured for operating different bank groups A and B with the time interval tCCD_S even when a read operation of a burst length (BL), which is set to a default value, e.g., '16', is performed on different bank groups A and B with the time interval tCCD_S. Here, the default value is exemplarily set to '16' in the present disclosure. However, the default value may vary. However, in the bank group mode, a timing margin might not be sufficient for operating the bank groups A and B with the time interval tCCD_S when a read operation of a burst length, which is set to an integer multiple of the default value, e.g., '32', which is twice the default value of '16', is performed on the bank groups A and B with the time interval tCCD_S. Therefore, a BL16 read operation may be first performed on the bank group A, this BL16 (i.e., a burst length set to '16') corresponding to the first half of the BL32 (i.e., a burst length set to '32'). Then, after the time interval tCCD_S, the bank group B may operate. After that, a BL16 read operation may then be performed on the bank group A during the subsequent time interval tCCD_S, this BL16 corresponding to the second half of the BL32. In accordance with an embodiment, the semiconductor apparatus 100 may be configured to keep the address of the bank group A unchanged during a time interval for the read operation on the bank group B for the BL32 read operation in the bank group mode.

Hereinafter, a read command of the BL16 and a read operation for the read command of the BL16 are respectively referred to as a BL16 read command and a BL16 read operation. Also, the read command of the BL32 and the read operation for the read command of the BL32 are respectively referred to as a BL32 read command and a BL32 read operation. A BL16 read operation, which corresponds to a first half of the BL32 read operation to be performed in response to the BL32 read command, is referred to as a first BL32 read operation. A BL16 read operation, which corresponds to a second half of the BL32 read operation to be performed in response to the BL32 read command, is referred to as a second BL32 read operation.

Figure 3:
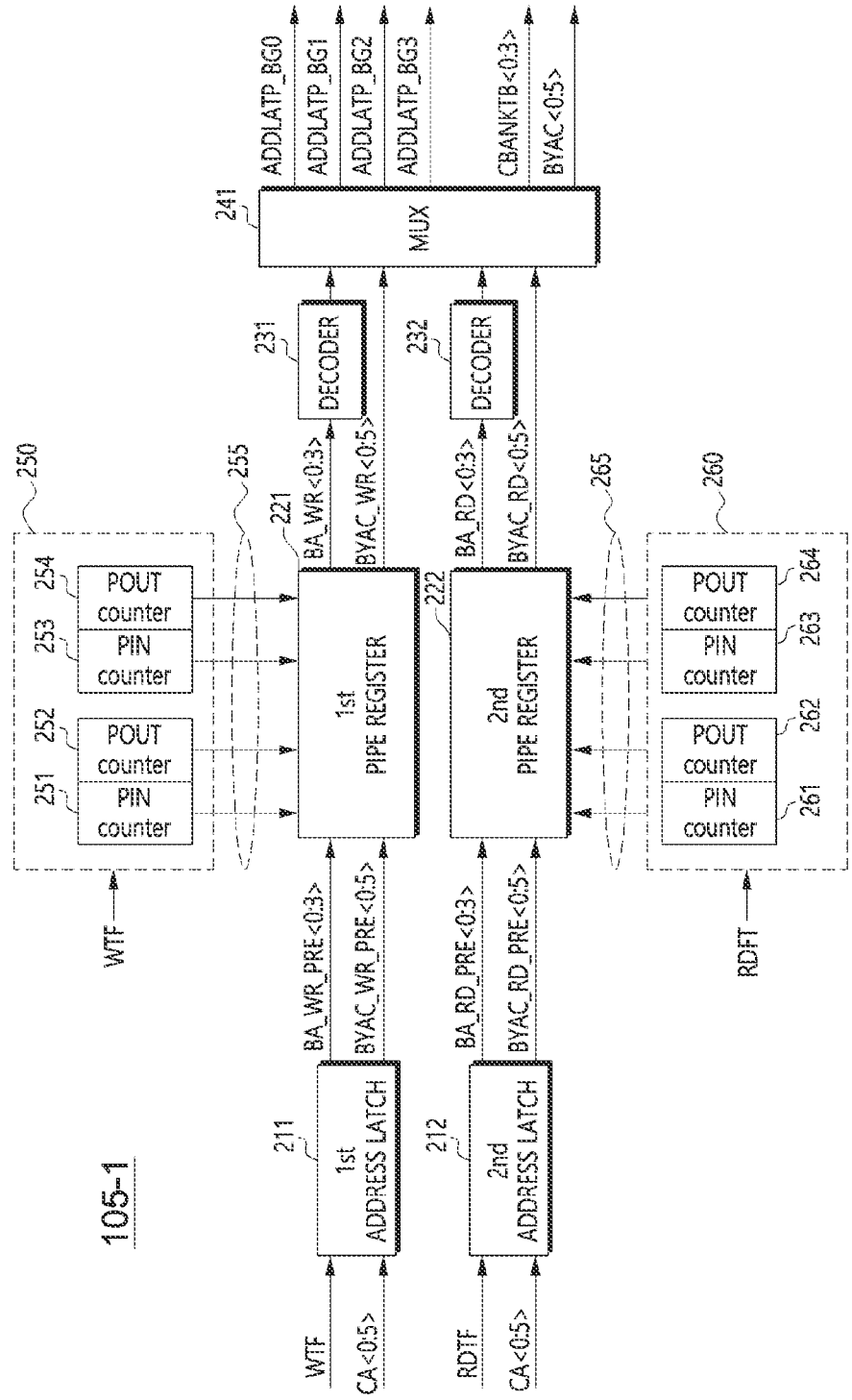
FIG. 3 is a diagram illustrating a configuration of an address control circuit in accordance with an embodiment.

FIG. 3 is a diagram illustrating a configuration of an address control circuit 105-1 in accordance with an embodiment.

Referring to FIG. 3, the address control circuit 105-1 may be included in the control circuit 105, described with reference to FIG. 1.

The address control circuit 105-1 may include a first address latch 211, a second address latch 212, a first pipe register 221, a second pipe register 222, a first decoder 231, a second decoder 232, a multiplexer 241, a first input/output control circuit 250, and a second input/output control circuit 260. Each of the first address latch 211, the second address latch 212, the first pipe register 221, the second pipe register 222, the first decoder 231, the second decoder 232, the multiplexer 241, the first input/output control circuit 250, and the second input/output control circuit 260 may operate by receiving a clock signal (not illustrated).

According to a write command signal WTF, the first address latch 211 may latch external address signals CA<0:5> to generate first write address latch signals BA_WR_PRE<0:3> and BYAC_WR_PRE<0:5>. Among the first write address latch signals BA_WR_PRE<0:3> and BYAC_WR_PRE<0:5>, the first write bank address latch signals BA_WR_PRE<0:3> may be utilized as a bank address for selecting the plurality of memory banks BK (illustrated in FIG. 2) during a write operation of the semiconductor apparatus 100. Among the first write address latch signals BA_WR_PRE<0:3> and BYAC_WR_PRE<0:

5>, the first write column address latch signals BYAC_WR_PRE<0:5> may be utilized as a column address for accessing a column of the memory bank, which is selected by the first write bank address latch signals BA_WR_PRE<0:3>, during a write operation of the semiconductor apparatus 100.

According to a read command signal RDTF, the second address latch 212 may latch the external address signals CA<0:5> to generate first read address latch signals BA_RD_PRE<0:3> and BYAC_RD_PRE<0:5>. Among the first read address latch signals BA_RD_PRE<0:3> and BYAC_RD_PRE<0:5>, the first read bank address latch signals BA_RD_PRE<0:3> may be utilized as a bank address for selecting the plurality of memory banks BK (illustrated in FIG. 2) during a read operation of the semiconductor apparatus 100. Among the first read address latch signals BA_RD_PRE<0:3> and BYAC_RD_PRE<0:5>, the first read column address latch signals BYAC_RD_PRE<0:5> may be utilized as a column address for accessing a column of the memory bank, which is selected by the first read bank address latch signals BA_RD_PRE<0:3>, during a read operation of the semiconductor apparatus 100.

The first pipe register 221 may store, therein, the first write address latch signals BA_WR_PRE<0:3> and BYAC_WR_PRE<0:5> based on a plurality of input/output control signals 255 and may output the stored signals as second write address latch signals BA_WR<0:3> and BYAC_WR<0:5>. The second write address latch signals BA_WR<0:3> and BYAC_WR<0:5> may be divided into second write bank address latch signals BA_WR<0:3> and second write column address latch signals BYAC_WR<0:5>.

The second pipe register 222 may store, therein, the first read address latch signals BA_RD_PRE<0:3> and BYAC_RD_PRE<0:5> based on a plurality of input/output control signals 265 and may output the stored signals as second read address latch signals BA_RD<0:3> and BYAC_RD<0:5>. The second read address latch signals BA_RD<0:3> and BYAC_RD<0:5> may be divided into second read bank address latch signals BA_RD<0:3> and second read column address latch signals BYAC_RD<0:5>.

The first decoder 231 may decode the second write bank address latch signals BA_WR<0:3> to generate third address latch signals ADDLATP_BG0, ADDLATP_BG1, ADDLATP_BG2, ADDLATP_BG3, and CBANKTB<0:3>. The third address latch signals ADDLATP_BG0, ADDLATP_BG1, ADDLATP_BG2, ADDLATP_BG3, and CBANKTB<0:3> may be divided into third bank group address latch signals ADDLATP_BG0, ADDLATP_BG1, ADDLATP_BG2, and ADDLATP_BG3 and third bank address latch signals CBANKTB<0:3>.

The first decoder 231 may decode partial bits (e.g., BA_WR<0:1>) of the second write bank address latch signals BA_WR<0:3> to generate the third bank group address latch signals ADDLATP_BG0, ADDLATP_BG1, ADDLATP_BG2, and ADDLATP_BG3 and may decode the remaining bits (e.g., BA_WR<2:3>) of the second write bank address latch signals BA_WR<0:3> to generate the third bank address latch signals CBANKTB<0:3>.

The second decoder 232 may decode the second read bank address latch signals BA_RD<0:3> to generate the third address latch signals ADDLATP_BG0, ADDLATP_BG1, ADDLATP_BG2, ADDLATP_BG3, and CBANKTB<0:3>.

The second decoder 232 may decode partial bits (e.g., BA_RD<0:1>) of the second read bank address latch signals BA_RD<0:3> to generate the third bank group address latch signals ADDLATP_BG0, ADDLATP_BG1, ADDLATP_BG2, and ADDLATP_BG3 and may decode the remaining bits (e.g., BA_RD<2:3>) of the second read bank address latch signals BA_RD<0:3> to generate the third bank address latch signals CBANKTB<0:3>.

During a write operation of the semiconductor apparatus 100, the multiplexer 241 may select and output the third bank group address latch signals ADDLATP_BG0, ADDLATP_BG1, ADDLATP_BG2, and ADDLATP_BG3 and the third bank address latch signals CBANKTB<0:3>, which are output from the first decoder 231, and may output the second write column address latch signals BYAC_WR<0:5> as third column address latch signals BYAC<0:5>.

During a read operation of the semiconductor apparatus 100, the multiplexer 241 may select and output the third bank group address latch signals ADDLATP_BG0, ADDLATP_BG1, ADDLATP_BG2, and ADDLATP_BG3 and the third bank address latch signals CBANKTB<0:3>, which are output from the second decoder 232, and may output the second read column address latch signals BYAC_RD<0:5> as the third column address latch signals BYAC<0:5>.

During a write operation of the semiconductor apparatus 100, the first input/output control circuit 250 may generate the plurality of input/output control signals 255 to satisfy a predetermined condition. The first input/output control circuit 250 may generate the plurality of input/output control signals 255 according to the write command signal WTF or/and at least a single signal that is generated with reference to the write command signal WTF.

The first input/output control circuit 250 may include a plurality of counters 251 to 254. The first counter (PIN counter) 251 may generate a control signal for controlling an input timing of the first write bank address latch signals BA_WR_PRE<0:3>. The second counter (POUT counter) 252 may generate a control signal for controlling an output timing of the first write bank address latch signals BA_WR_PRE<0:3>. The third counter (PIN counter) 253 may generate a control signal for controlling an input timing of the first write column address latch signals BYAC_WR_PRE<0:5>. The fourth counter (POUT counter) 254 may generate a control signal for controlling an output timing of the first write column address latch signals BYAC_WR_PRE<0:5>.

During a read operation of the semiconductor apparatus 100, the second input/output control circuit 260 may generate the plurality of input/output control signals 265 to satisfy a predetermined condition. The second input/output control circuit 260 may generate the plurality of input/output control signals 265 according to the read command signal RDTF or/and at least a single signal that is generated with reference to the read command signal RDTF.

The second input/output control circuit 260 may include a plurality of counters 261 to 264. The first counter (PIN counter) 261 may generate a control signal for controlling an input timing of the first read bank address latch signals BA_RD_PRE<0:3>. The second counter (POUT counter) 262 may generate a control signal for controlling an output timing of the first read bank address latch signals BA_RD_PRE<0:3>. The third counter (PIN counter) 263 may generate a control signal for controlling an input timing of the first read column address latch signals BYAC_RD_PRE<0:5>. The fourth counter (POUT counter) 264 may generate a control signal for controlling an output timing of the first read column address latch signals BYAC_RD_PRE<0:5>.

Figure 4:
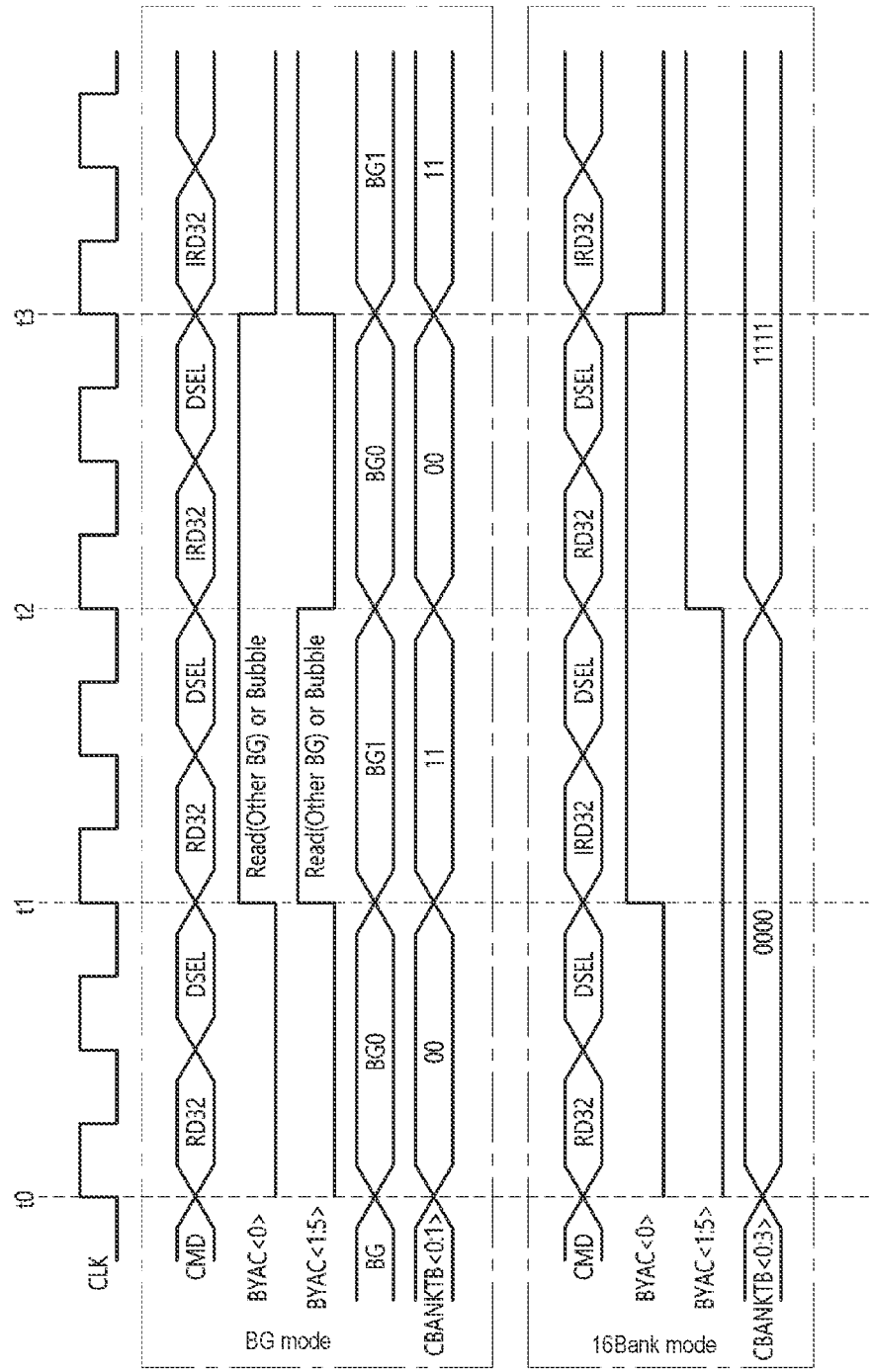
FIG. 4 is a timing diagram illustrating read operations for respective operational modes in accordance with an embodiment.

FIG. 4 is a timing diagram illustrating read operations for respective operational modes in accordance with an embodiment.

Hereinafter, described with reference to FIGS. 3 and 4, operations of the address control circuit 105-1 for the 16-bank mode and the bank group mode (BG mode) will be disclosed.

In the 16-bank mode, a command CMD and external address signals CA<0:5> may be sequentially input with reference to a clock signal CLK through command/address pins. For example, the command CMD may be input at a first timing t0. Then, the external address signals CA<0:5> may be input during a single period time interval DSEL of a second clock signal with reference to the first timing t0.

When a BL32 read command RD32 and the external address signals CA<0:5> are input at the first timing t0, the address control circuit 105-1 may generate the third bank address latch signals CBANKTB<0:3> and the third column address latch signals BYAC<0:5>.

According to the third bank address latch signals CBANKTB<0:1>, a first memory bank may be selected.

A first BL32 read operation may be performed on the first memory bank based on the third bank address latch signals CBANKTB<0:1> and the third column address latch signals BYAC<0:5>.

At a second timing t1, an internal read command IRD32 may be internally generated within the semiconductor apparatus 100 for a second BL32 read operation to be performed on the first memory bank in response to the BL32 read command RD32.

According to the internal read command IRD32, a value of the third bank address latch signals CBANKTB<0:3> may remain unchanged, and a value of the third column address latch signals BYAC<0:5> may change. According to the third bank address latch signals CBANKTB<0:3> and the changed third column address latch signals BYAC<0:5>, the second BL32 read operation may be performed on the first memory bank.

When another BL32 read command RD32 and the external address signals CA<0:5> are input at a third timing t2, the address control circuit 105-1 may generate the third bank address latch signals CBANKTB<0:3> and the third column address latch signals BYAC<0:5>.

According to the third bank address latch signals CBANKTB<0:1>, a second memory bank may be selected.

A first BL32 read operation may be performed on the second memory bank based on the third bank address latch signals CBANKTB<0:1> and the third column address latch signals BYAC<0:5>.

At a fourth timing t3, the internal read command IRD32 may be internally generated within the semiconductor apparatus 100 for a second BL32 read operation to be performed on the second memory bank in response to the BL32 read command RD32.

According to the internal read command IRD32, the value of the third bank address latch signals CBANKTB<0:3> may remain unchanged, and the value of the third column address latch signals BYAC<0:5> may change. According to the third bank address latch signals CBANKTB<0:3> and the changed third column address latch signals BYAC<0:5>, the second BL32 read operation may be performed on the second memory bank.

In the bank group mode, the command CMD may be input at a first timing t0. Then, the external address signals CA<0:5> may be input during a single period time interval DSEL of a second clock signal with reference to the first timing t0.

When a BL32 read command RD32 and the external address signals CA<0:5> are input at the first timing t0, the address control circuit 105-1 may generate the third bank group address latch signals ADDLATP_BG0, ADDLATP_BG1, ADDLATP_BG2, and ADDLATP_BG3, the third bank address latch signals CBANKTB<0:1>, and the third column address latch signals BYAC<0:5>.

According to the third bank group address latch signals ADDLATP_BG0, ADDLATP_BG1, ADDLATP_BG2, and ADDLATP_BG3 and the third bank address latch signals CBANKTB<0:1>, a memory bank within the first bank group BG0 may be selected.

According to the third bank address latch signals CBANKTB<0:1> and the third column address latch signals BYAC<0:5>, a first BL32 read operation may be performed on the memory bank of the first bank group BG0.

When another BL32 read command RD32 and the external address signals CA<0:5> are input at a second timing t1, the address control circuit 105-1 may generate the third bank group address latch signals ADDLATP_BG0, ADDLATP_BG1, ADDLATP_BG2, and ADDLATP_BG3 and the third bank address latch signals CBANKTB<0:1>.

According to the third bank group address latch signals ADDLATP_BG0, ADDLATP_BG1, ADDLATP_BG2, and ADDLATP_BG3 and the third bank address latch signals CBANKTB<0:1>, a memory bank within the second bank group BG1 may be selected.

According to the first read address latch signals BA_RD_PRE<0:3> and BYAC_RD_PRE<0:5> that correspond to the BL32 read command RD32, which is input at the second timing t1 and for the second bank group BG1, the values of the third bank address latch signals CBANKTB<0:1> and the third column address latch signals BYAC<0:5> may change. According to the changed third bank address latch signals CBANKTB<0:1> and the changed third column address latch signals BYAC<0:5>, the first BL32 read operation may be performed on the memory bank of the second bank group BG1.

In the case that a BL32 read command RD32 is not input for another bank group at the second timing t1, a timing margin might not be sufficient for operating the first and second bank groups with the time interval tCCD_S with reference to the BL32, as described above. Therefore, a read operation may be required to not perform during the corresponding time interval between the second and third timings t1 and t2, which may be referred to as a non-operating time interval or a "Bubble". During the time intervals between the second and third timings t1 and t2, the first read address latch signals BA_RD_PRE<0:3> and BYAC_RD_PRE<0:5> that correspond to the BL32 read command RD32, which is input at the first timing t0 and for the first bank group BG0, may be stored in the second pipe register 222 (illustrated in FIG. 3) and may remain unchanged for a second BL32 read operation to be performed on the memory bank of the first bank group BG0. This will be described later.

At the third timing t2, an internal read command IRD32 may be internally generated within the semiconductor apparatus 100 for a second BL32 read operation to be performed on the memory bank of the first bank group BG0 in response to the BL32 read command RD32.

The first read address latch signals BA_RD_PRE<0:3> and BYAC_RD_PRE<0:5> that correspond to the BL32 read command RD32 for the first bank group BG0 may be stored in the second pipe register 222 and may remain unchanged. Therefore, the value of the third bank address latch signals CBANKTB<0:1> and the third column address latch signals BYAC<0:5>, which changed for the second bank group BG1 at the second timing t1, may change again for the first bank group BG0 based on the internal read command IRD32 at the third timing t2. According to the third bank address latch signals CBANKTB<0:1> and the third column address latch signals BYAC<0:5>, which change again for the first bank group BG0, the second BL32 read operation may be performed on the memory bank of the first bank group BG0.

At a fourth timing t3, an internal read command IRD32 may be internally generated within the semiconductor apparatus 100 for a second BL32 read operation to be performed on the memory bank of the second bank group BG1 in response to the BL32 read command RD32.

The first read address latch signals BA_RD_PRE<0:3> and BYAC_RD_PRE<0:5> that correspond to the BL32 read command RD32 for the second bank group BG1 may be stored in the second 1o pipe register 222 and may remain unchanged. Therefore, the value of the third bank address latch signals CBANKTB<0:1> and the third column address latch signals BYAC<0:5>, which changed for the first bank group BG0 at the third timing t2, may change again for the second bank group BG1 based on the internal read command IRD32 at the fourth timing t3. According to the third bank address latch signals CBANKTB<0:1> and the third column address latch signals BYAC<0:5>, which change again for the second bank group BG1, the second BL32 read operation may be performed on the memory bank of the second bank group BG1.

During the BL32 read operation in the bank group mode different from the 16-bank mode, the first BL32 read operation and the second BL32 read operation might not be continuously performed. That is, the first BL32 read operation may be first performed on a bank group, and then, after a time interval in which a read operation performed on another bank group, or the "Bubble", the second BL32 read operation may be performed on the bank group. Therefore, in order to store the first read address latch signals BA_RD_PRE<0:3> and BYAC_RD_PRE<0:5> that are utilized in the first BL32 read operation and in order to utilize the stored first read address latch signals BA_RD_PRE<0:3> and BYAC_RD_PRE<0:5> in the second BL32 read operation, the address control circuit 105-1 may be provided to independently latch an address for each of a read operation and a write operation, as illustrated in FIG. 3.

Figure 5:
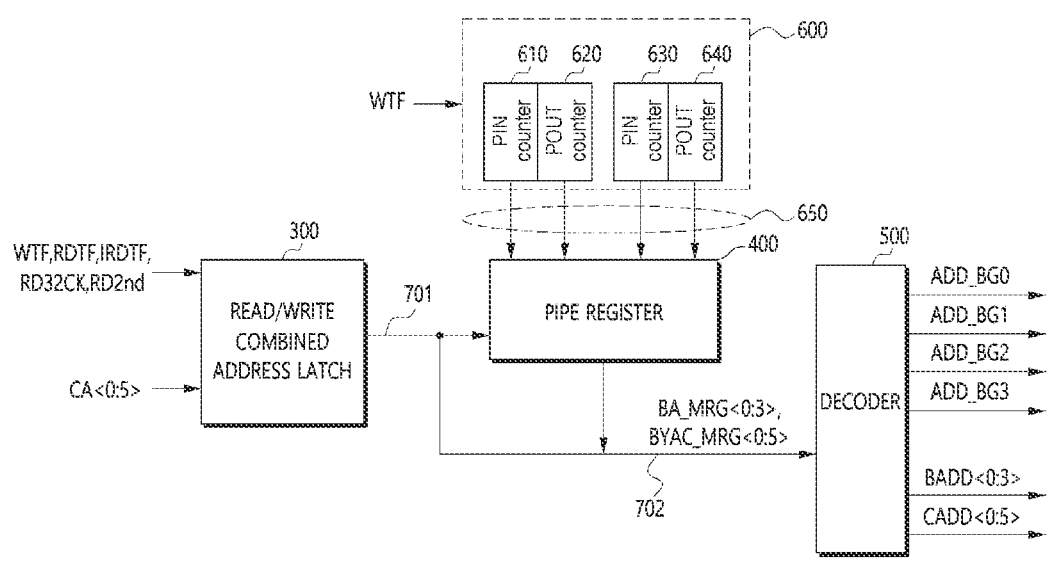
FIG. 5 is a diagram illustrating a configuration of an address control circuit in accordance with an embodiment.

FIG. 5 is a diagram illustrating a configuration of an address control circuit 105-2 in accordance with an embodiment.

Referring to FIG. 5, the address control circuit 105-2 may be included in the control circuit 105, described with reference to FIG. 1.

The address control circuit 105-2 may include a read/write combined address latch 300, a pipe register 400, a decoder 500, and an input/output control circuit 600. Each of the read/write combined address latch 300, the pipe register 400, the decoder 500, and the input/output control circuit 600 may operate by receiving a clock signal (not illustrated).

The read/write combined address latch 300 may latch, through a first signal path, external address signals CA<0:5> based on a read command or a write command of the semiconductor apparatus 100 to output the latched signal through an output node. During a BL32 read operation, the read/write combined address latch 300 may latch, through a second signal path, the external address signals CA<0:5> to output the latched signals through a first output line 701 based on an internal read command. The first output line 701 may be coupled to the pipe register 400. A second output line 702, which is coupled to the first output line 701, may be coupled to the decoder 500.

According to a read command signal RDTF, a write command signal WTF, an internal read command signal IRDTF, a first read timing signal RD32CK, and a second read timing signal RD2nd, the read/write combined address latch 300 may latch the external address signals CA<0:5> to generate first combined address latch signals BA_MRG<0:3> and BYAC_MRG<0:5>. The read/write combined address latch 300 may provide the first combined address latch signals BA_MRG<0:3> and BYAC_MRG<0:5> to the pipe register 400 and the decoder 500.

The first combined address latch signals BA_MRG<0:3> and BYAC_MRG<0:5> may be divided into first combined bank address latch signals BA_MRG<0:3> and first combined column address latch signals BYAC_MRG<0:5>. The first combined bank address latch signals BA_MRG<0:3> may be utilized as a bank address for selecting the plurality of memory banks BK (illustrated in FIG. 2). The first combined column address latch signals BYAC_MRG<0:5> may be utilized as a column address for accessing a column of the memory bank, which is selected by the first combined bank address latch signals BA_MRG<0:3>.

When any one of the read command signal RDTF and the write command signal WTF is enabled, the read/write combined address latch 300 may latch the external address signals CA<0:5> and may output the latched signals as the first combined address latch signals BA_MRG<0:3> and BYAC_MRG<0:5>. The read/write combined address latch 300 may latch the external address signals CA<0:5> according to the first read timing signal RD32CK to generate first latch signals. The read/write combined address latch 300 may latch the first latch signals according to the second read timing signal RD2nd to generate second latch signals. The read/write combined address latch 300 may output the second latch signals as the first combined address latch signals BA_MRG<0:3> and BYAC_MRG<0:5> according to the internal read command signal IRDTF.

The pipe register 400 may store, therein, through the first output line 701, the first combined address latch signals BA_MRG<0:3> and BYAC_MRG<0:5> that correspond to a write operation of the semiconductor apparatus 100 based on a plurality of input/output control signals 650 and may output, through the second output line 702, the stored signals as the first combined address latch signals BA_MRG<0:3> and BYAC_MRG<0:5>.

The decoder 500 may receive the first combined address latch signals BA_MRG<0:3> and BYAC_MRG<0:5> through the second output line 702 and decode the first combined address latch signals BA_MRG<0:3> and BYAC_MRG<0:5> to generate second combined address latch signals ADD_BG0, ADD_BG1, ADD_BG2, ADD_BG3, BADD<0:3>, and CADD<0:5>. The second combined address latch signals ADD_BG0, ADD_BG1, ADD_BG2, ADD_BG3, BADD<0:3>, and CADD<0:5> may be divided into second combined bank group address latch signals ADD_BG0, ADD_BG1, ADD_BG2, and ADD_BG3, second combined bank address latch signals BADD<0:3>, and second combined column address latch signals CADD<0:5>.

The decoder 500 may decode partial bits (e.g., BA_MRG<0:1>) of the first combined bank address latch signals BA_MRG<0:3> to generate the second combined bank group address latch signals ADD_BG0, ADD_BG1, ADD_BG2, and ADD_BG3 and may decode the remaining bits (e.g., BA_MRG<2:3>) of the first combined bank address latch signals BA_MRG<0:3> to generate the second combined bank address latch signals BADD<0:3>. The decoder 500 may output the first combined column address latch signals BYAC_MRG<0:5> as the second combined column address latch signals CADD<0:5>.

During a write operation of the semiconductor apparatus 100, the input/output control circuit 600 may generate the plurality of input/output control signals 650 to satisfy a predetermined condition. The input/output control circuit 600 may generate the plurality of input/output control signals 650 according to at least a single signal generate with reference to the write command signal WTF.

During a read operation of the semiconductor apparatus 100, the input/output control circuit 600 may control values of the plurality of input/output control signals 650 for the first combined address latch signals BA_MRG<0:3> and BYAC_MRG<0:5>, which are output from the read/write combined address latch 300, to not be input to the pipe register 400. Therefore, the pipe register 400 may operate during a write operation of the semiconductor apparatus 100 and might not operate during a read operation of the semiconductor apparatus 100.

The input/output control circuit 600 may include a plurality of counters 610 to 640. The first counter (PIN counter) 610 may generate a control signal for controlling an input timing of the first combined bank address latch signals BA_MRG<0:3>. The second counter (POUT counter) 620 may generate a control signal for controlling an output timing of the first combined bank address latch signals BA_MRG<0:3>. The third counter (PIN counter) 630 may generate a control signal for controlling an input timing of the first combined column address latch signals BYAC_MRG<0:5>. The fourth counter (POUT counter) 640 may generate a control signal for controlling an output timing of the first combined column address latch signals BYAC_MRG<0:5>.

Figure 6:
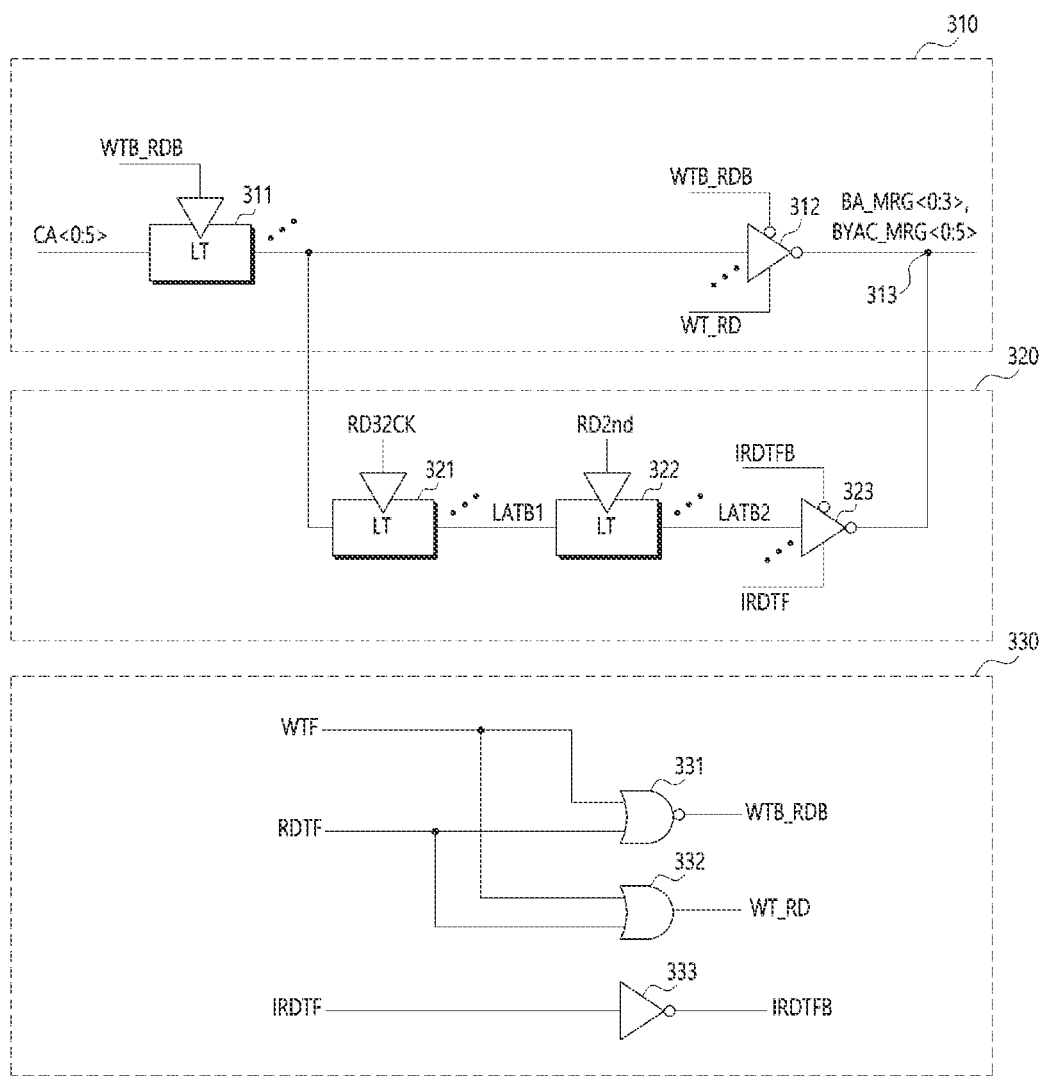
FIG. 6 is a diagram illustrating a configuration of a read/write combined address latch of FIG. 5.

FIG. 6 is a diagram illustrating a configuration of the read/write combined address latch 300 of FIG. 5.

Referring to FIG. 6, the read/write combined address latch 300 may include a first address processing unit 310 and a second address processing unit 320. The first address processing unit 310 may operate as the first signal path, and the second address processing unit 320 may operate as the second signal path.

According to the read/write command signal WT_RD and the inverted read/write command signal WTB_RDB, the first address processing unit 310 may latch the external address signals CA<0:5> and may output, through an output node 313, the latched signals as the first combined address latch signals BA_MRG<0:3> and BYAC_MRG<0:5>.

The first address processing unit 310 may include a plurality of latches 311 and a plurality of logic gates 312. The plurality of latches 311 may latch the external address signals CA<0:5> based on the inverted read/write command signal WTB_RDB. The plurality of logic gates 312 may output the signals, which are latched by the plurality of latches 311, as the first combined address latch signals BA_MRG<0:3> and BYAC_MRG<0:5> through the output node 313 based on the read/write command signal WT_RD and the inverted read/write command signal WTB_RDB.

The second address processing unit 320 may perform control according to the external address signals CA<0:5>, which are latched by the first address processing unit 310, the first read timing signal RD32CK, and the second read timing signal RD2nd to generate the first combined address latch signals BA_MRG<0:3> and BYAC_MRG<0:5> through the output node 313 based on the internal read command signal IRDTF.

The second address processing unit 320 may latch the external address signals CA<0:5>, which are latched by the first address processing unit 310, according to the first read timing signal RD32CK to generate first latch signals LATB1. The second address processing unit 320 may latch the first latch signals LATB1 according to the second read timing signal RD2nd to generate second latch signals LATB2. The second address processing unit 320 may output the second latch signals LATB2 as the first combined address latch signals BA_MRG<0:3> and BYAC_MRG<0:5> through the output node 313 according to the internal read command signal IRDTF and the inverted internal read command signal IRDTFB.

The second address processing unit 320 may include a plurality of first latches 321, a plurality of second latches 322 and a plurality of logic gates 323. The plurality of first latches 321 may latch the external address signals CA<0:5>, which are latched by the first address processing unit 310, according to the first read timing signal RD32CK to generate the first latch signals LATB1. The plurality of second latches 322 may latch the first latch signals LATB1 based on the second read timing signal RD2nd to generate the second latch signals LATB2. The plurality of logic gates 323 may output the second latch signals LATB2 as the first combined address latch signals BA_MRG<0:3> and BYAC_MRG<0:5> through the output node 313 based on the internal read command signal IRDTF and the inverted internal read command signal IRDTFB.

The inverted internal read command signal IRDTFB, the inverted read/write command signal WTB_RDB and the read/write command signal WT_RD may be generated from the control circuit 105, illustrated in FIG. 1, or may be generated from a circuit block that is related to read/write operations other than the address processing. Also, the inverted internal read command signal IRDTFB, the inverted read/write command signal WTB_RDB, and the read/write command signal WT_RD may be generated from the address control circuit 105-2.

The read/write combined address latch 300 may further include a control logic 330 configured to generate the inverted internal read command signal IRDTFB, the inverted read/write command signal WTB_RDB, and the read/write command signal WT_RD. The control logic 330 may include a plurality of logic gates 331 to 333. The first logic gate 331 may perform a NOR operation on the write command signal WTF and the read command signal RDTF to generate the inverted read/write command signal WTB_RDB. The second logic gate 332 may perform an OR operation on the write command signal WTF and the read command signal RDTF to generate the read/write command signal WT_RD. The third logic gate 333 may receive the internal read command signal IRDTF to generate the inverted internal read command signal IRDTFB.

Figure 7:
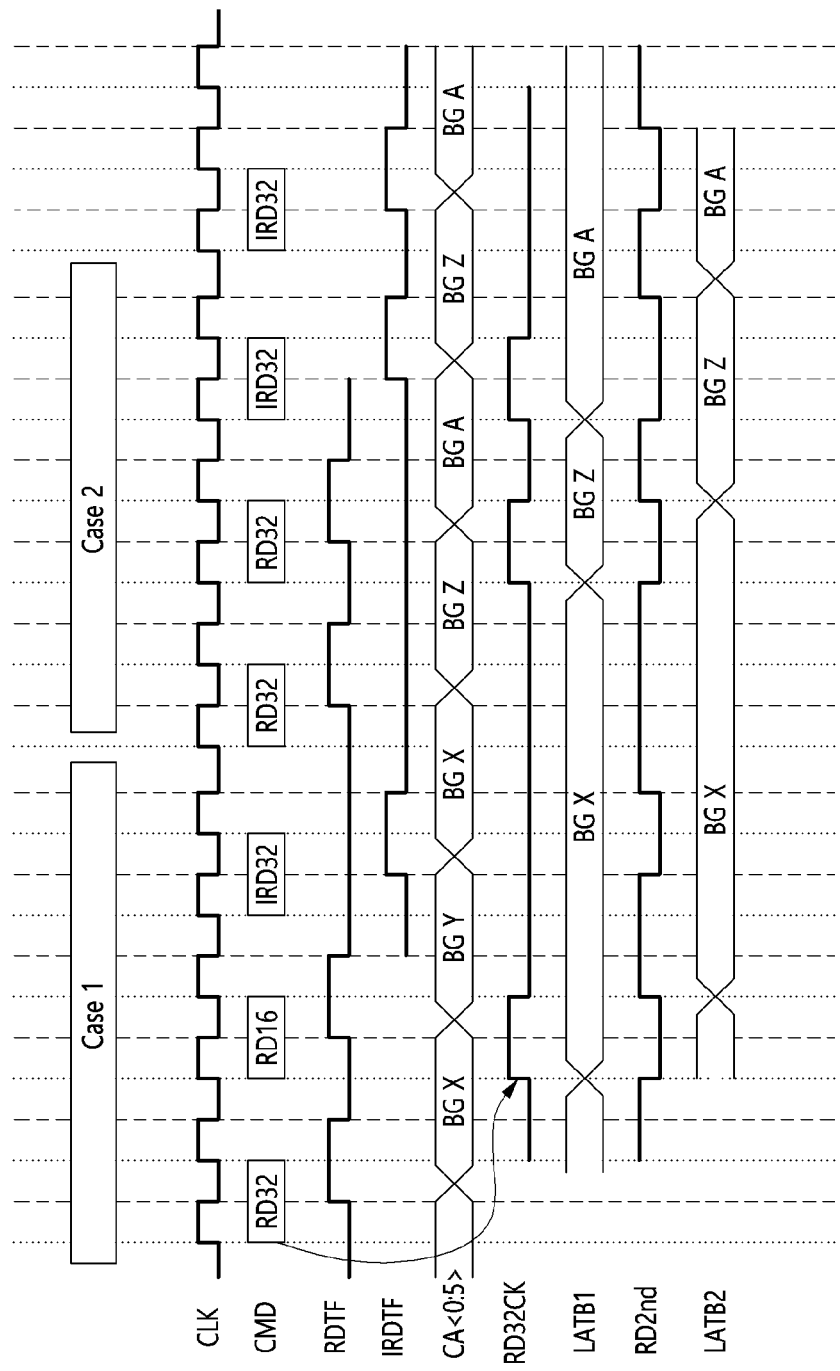
FIG. 7 is a timing diagram illustrating read operations for respective operational modes in accordance with an embodiment.

FIG. 7 is a timing diagram illustrating read operations for respective operational modes in accordance with an embodiment.

Hereinafter, described with reference to FIGS. 5 to 7, operations of the address control circuit 105-2 will be disclosed.

In case 1 "Case 1" in which the semiconductor apparatus 100 operates in the bank group mode and a BL32 read command and a BL16 read command are continuously input, the read command signal RDTF may be generated a predetermined time after the BL32 read command RD32 and the external address signals CA<0:5> are input.

The inverted read/write command signal WTB_RDB may be generated by the read command signal RDTF, and the external address signals CA<0:5> may be latched based on the inverted read/write command signal WTB_RDB.

The latched external address signals CA<0:5> may be output as the first combined address latch signals BA_MRG<0:3> and BYAC_MRG<0:5> based on the read/write command signal WT_RD and the inverted read/write command signal WTB_RDB.

The first combined address latch signals BA_MRG<0:3> and BYAC_MRG<0:5> may be decoded by the decoder 500 to generate the second combined bank address latch signals BADD<0:3> and the second combined column address latch signals CADD<0:5>.

According to the second combined bank address latch signals BADD<0:3> and the second combined column address latch signals CADD<0:5>, a first BL32 read operation may be performed on a memory bank of a bank group X ("BG X").

Then, the read command signal RDTF may be generated a predetermined time after the BL16 read command RD16 and the external address signals CA<0:5> are input.

The inverted read/write command signal WTB_RDB may be generated by the read command signal RDTF, and the external address signals CA<0:5> may be latched based on the inverted read/write command signal WTB_RDB to output the latched external address signals CA<0:5> as the first combined address latch signals BA_MRG<0:3> and BYAC_MRG<0:5>.

The first combined address latch signals BA_MRG<0:3> and BYAC_MRG<0:5> may be decoded by the decoder 500 to generate the second combined bank address latch signals 1o BADD<0:3> and the second combined column address latch signals CADD<0:5>.

According to the second combined bank address latch signals BADD<0:3> and the second combined column address latch signals CADD<0:5>, a BL16 read operation may be performed on a memory bank of a bank group Y ("BG Y").

The first read timing signal RD32CK and the second read timing signal RD2nd may be generated a predetermined number of times, respectively, after the BL32 read command RD32 that corresponds the bank group X ("BG X") is input.

The first read timing signal RD32CK may be generated the time 2tCK after the BL32 read command RD32 is input. The tCK corresponds to a time of 1-cycle of the clock signal CLK. The second read timing signal RD2nd may be generated by NORinq the first read timing signal RD32CK and the internal read command signal IRDTF.

The first latch signals LATB1 may be generated based on the first read timing signal RD32CK. The second latch signals LATB2 may be generated according to the second read timing signal RD2nd.

While the BL16 read operation is being performed on the bank group Y ("BG Y"), the first combined address latch signals BA_MRG<0:3> and BYAC_MRG<0:5> that correspond to the BL32 read command RD32 for the bank group X ("BG X"), i.e., the second latch signals LATB2, may be stored in the second address processing unit 320 and may remain unchanged for the second BL32 read operation to be performed on the memory bank of the bank group X ("BG X").

After the BL16 read operation on the memory bank of the bank group Y ("BG Y"), an internal read command IRD32 may be internally generated within the semiconductor apparatus 100 for the second BL32 read operation to be performed on the memory bank of the bank group X ("BG X") in response to the BL32 read command RD32. The internal read command signal IRDTF may be generated based on the internal read command IRD32.

The second latch signals LATB2 may be output as the first combined address latch signals BA_MRG<0:3> and BYAC_MRG<0:5> based on the internal read command signal IRDTF and the inverted internal read command signal IRDTFB.

The first combined address latch signals BA_MRG<0:3> and BYAC_MRG<0:5> may be decoded by the decoder 500 to generate the second combined bank address latch signals BADD<0:3> and the second combined column address latch signals CADD<0:5>.

According to the second combined bank address latch signals BADD<0:3> and the second combined column address latch signals CADD<0:5>, a second BL32 read operation may be performed on the memory bank of the bank group X ("BG X").

In case 2 "Case 2" in which the semiconductor apparatus 100 operates in the bank group mode and BL32 read commands are continuously input, a first BL32 read operation may be performed on a bank group Z ("BG Z") in response to the BL32 read command RD32.

Then, a first BL32 read operation may be performed on a bank group A ("BG A") in response to another BL32 read command RD32.

While the first BL32 read operation is being performed on the bank group A ("BG A") in response to the BL32 read command RD32 for the bank group A ("BG A"), the first combined address latch signals BA_MRG<0:3> and BYAC_MRG<0:5> that correspond to the BL32 read command RD32 for the bank group Z ("BG Z"), i.e., the second latch signals LATB2, may be stored in the second address processing unit 320 and may remain unchanged for the second BL32 read operation to be performed on the memory bank of the bank group Z ("BG Z").

After the first BL32 read operation on the bank group A ("BG A") for the BL32 read command RD32, an internal read command IRD32 may be internally generated within the semiconductor apparatus 100 for the second BL32 read operation to be performed on the memory bank of the bank group Z ("BG Z") in response to the BL32 read command RD32.

According to the internal read command IRD32 for the bank group Z ("BG Z"), the second BL32 read operation may be performed on the bank group Z ("BG Z").

While the second BL32 read operation is being performed on the bank group Z ("BG Z") in response to the internal read command IRD32 for the bank group Z ("BG Z"), the first combined address latch signals BA_MRG<0:3> and BYAC_MRG<0:5> that correspond to the BL32 read command RD32 for the bank group A ("BG A"), i.e., the second latch signals LATB2 may be stored in the second address processing unit 320 and may remain unchanged for the second BL32 read operation to be performed on the memory bank of the bank group A ("BG A").

After the second BL32 read operation on the bank group Z ("BG Z") for the internal read command IRD32, an internal read command IRD32 may be internally generated within the semiconductor apparatus 100 for the second BL32 read operation to be performed on the memory bank of the bank group A ("BG A") in response to the BL32 read command RD32.

According to the internal read command IRD32 for the bank group A ("BG A"), the second BL32 read operation may be performed on the bank group A ("BG A").

In accordance with an embodiment, the address control circuit 105-2 may store the addresses of a bank group 1, on which the first BL32 read operation is performed, into the read/write combined address latch 300 during the time interval in which the first BL32 read operation is performed on a bank group 2, or the time interval referred to as the "Bubble" and may output the stored addresses before the second BL32 read operation is performed on the bank group 1. Therefore, as illustrated in FIG. 5, the address control circuit 105-2 may be configured by the reduced circuit configurations, that is, configured by the single read/write combined address latch 300, the single pipe register 400 and the single decoder 500 when compared with the embodiment of FIG. 3.

While certain embodiments have been described above, it will be understood to those skilled in the art that the embodiments described are by way of example only. Accordingly, the address latch, address control circuit and semiconductor apparatus including the address control circuit should not be limited based on the described embodiments. Rather, the address latch, address control circuit and semiconductor apparatus including the address control circuit described herein should only be limited in light of the claims that follow when taken in conjunction with the above description and accompanying drawings.

What is claimed is:

1. An address latch comprising:
a first address processing unit configured to latch external address signals to output first latched signals through an output node based on a read command and a write command; and
a second address processing unit configured to latch the external address signals based on the read command with a burst length that is set to a first value and configured to output second latched signals through the output node based on an internal read command.

2. The address latch of claim 1, wherein the first value is an integer multiple of a default value of the burst length.

3. The address latch of claim 1, wherein the first address processing unit includes:
a plurality of latches configured to latch the external address signals based on a read/write command signal that is generated according to the read command and the write command; and
a plurality of logic gates configured to output the signals, which are latched by the plurality of latches, through the output node based on the read/write command signal.

4. The address latch of claim 1, wherein the second address processing unit includes:
a plurality of first latches configured to latch the external address signals based on a first read timing signal to generate first latch signals;
a plurality of second latches configured to latch the first latch signals based on a second read timing signal to generate second latch signals; and
a plurality of logic gates configured to output the second latch signals through the output node as the second latched signals based on the internal read command.

5. The address latch of claim 4, wherein the first read timing signal is generated a predetermined time after the read command with the burst length set to the first value is generated with reference to a clock signal, and wherein the second read timing signal is generated at a timing when a result of a logical combination of the first read timing signal and the internal read command is generated.

6. An address control circuit comprising:
a read/write combined address latch configured to latch external address signals based on a read command or a write command to output first latched signals through a first output line and configured to latch the external address signals based on the read command with a burst length set to a first value to output second latched signals, according to an internal read command, through the first output line;
a pipe register configured to store, therein, signals that are output through the first output line during a write operation of a semiconductor apparatus based on a plurality of input/output control signals and configured to output the stored signals through a second output line that is coupled to the first output line; and
a decoder configured to decode signals, which are output through the second output line, to generate at least one of a bank group address, a bank address, and a column address.

7. The address control circuit of claim 6, further comprising an input/output control circuit configured to generate the plurality of input/output control signals to satisfy a predetermined condition during the write operation of the semiconductor apparatus and configured to control values of the plurality of input/output control signals for signals, which are output from the read/write combined address latch, to not be output from the pipe register through the second output line during a read operation of the semiconductor apparatus.

8. The address control circuit of claim 6, wherein the read/write combined address latch includes:
a first address processing unit configured to latch, according to the read command and the write command, the external address signals to output the first latched signals through the first output line; and
a second address processing unit configured to latch, according to the read command with the burst length set to the first value, the external address signals and configured to output, according to the internal read command, the second latched signals through the first output line.

9. The address control circuit of claim 6, wherein the first value is an integer multiple of a default value of the burst length.

10. A semiconductor apparatus comprising:
a memory region including a plurality of memory cells, which are divided into a plurality of memory banks;
a data input/output circuit coupled to the memory region and configured to exchange data with the memory region or an external device;
an address control circuit configured to latch external address signals, which are input from the external device, according to a read command or a write command, to output first latched signals through a first output line, configured to latch the external address signals, according to the read command with a burst length set to a first value, to output second latched signals, according to an internal read command, through the first output line, and configured to decode signals, which are output through the first output line, to generate a bank group address, a bank address, and a column address; and an address decoder configured to decode the bank group address, the bank address, and the column address to access the memory region based on a result of the decoding.

11. The semiconductor apparatus of claim 10, wherein the semiconductor apparatus includes, as an operational mode thereof, a bank group mode in which the semiconductor apparatus divides the plurality of memory banks into a plurality of bank groups and controls the plurality of bank groups, and wherein, when the read command with the burst length set to the first value is provided to the semiconductor apparatus, the operational mode of which is set to the bank group mode, the semiconductor apparatus first performs a read operation of the burst length that corresponds to a first half of the first value on a first bank group, among the plurality of bank groups, and then, after a time interval for a read operation on a second bank group or a non-operating time interval, performs a read operation of the burst length that corresponds to a second half of the first value on the first bank group.

12. The semiconductor apparatus of claim 10, wherein the first value is an integer multiple of a default value of the burst length.

13. The semiconductor apparatus of claim 10, wherein the address control circuit includes:

a first address processing unit configured to latch, according to the read command and the write command, the external address signals to output the first latched signals through the first output line; and a second address processing unit configured to latch, according to the read command with the burst length set to the first value, the external address signals and configured to output, according to the internal read command, the second latched signals through the first output line.

14. The semiconductor apparatus of claim 13, wherein the first address processing unit includes:

a plurality of latches configured to latch the external address signals based on a read/write command signal that is generated according to the read command and the write command; and a plurality of logic gates configured to output the signals, which are latched by the plurality of latches, to an output node based on the read/write command signal.

15. The semiconductor apparatus of claim 13, wherein the second address processing unit includes:

a plurality of first latches configured to latch the external address signals based on a first read timing signal to generate first latch signals;

a plurality of second latches configured to latch the first latch signals based on a second read timing signal to generate second latch signals; and a plurality of logic gates configured to output the second latch signals through the first output line based on the internal read command.

16. The semiconductor apparatus of claim 10, wherein the address control circuit further includes:

a pipe register configured to store, therein, signals that are output through the first output line during a write operation of the semiconductor apparatus based on a plurality of input/output control signals and configured to output the stored signals through a second output line that is coupled to the first output line; and a decoder configured to decode signals, which are output through the second output line, to generate the bank group address, the bank address, and the column address.

17. The semiconductor apparatus of claim 16, further comprising an input/output control circuit configured to generate the plurality of input/output control signals to satisfy a predetermined condition during the write operation of the semiconductor apparatus and configured to control values of the plurality of input/output control signals for signals, which are output through the first output lines, to not be output from the pipe register through the second output line during a read operation of the semiconductor apparatus.

* * * * *